(12) United States Patent
Ko

(10) Patent No.: US 7,371,632 B2
(45) Date of Patent: May 13, 2008

(54) SEMICONDUCTOR DEVICE HAVING HIGH-VOLTAGE TRANSISTOR AND PIP CAPACITOR AND METHOD FOR FABRICATING THE SAME

(75) Inventor: Kwang Young Ko, Bucheon (KR)

(73) Assignee: Dongbu Electronics Co., Ltd, Seoul (KR)

( * ) Notice: Subject to any disclaimer, the term of this patent is extended or adjusted under 35 U.S.C. 154(b) by 246 days.

(21) Appl. No.: 11/320,485

(22) Filed: Dec. 29, 2005

(65) Prior Publication Data
US 2006/0145251 A1 Jul. 6, 2006

(30) Foreign Application Priority Data
Dec. 30, 2004 (KR) .................. 10-2004-0117434

(51) Int. Cl.
*H01L 21/8238* (2006.01)
*H01L 21/8234* (2006.01)
*H01L 21/8244* (2006.01)

(52) U.S. Cl. ............... 438/210; 438/218; 438/238; 257/E27.071

(58) Field of Classification Search ........ 438/210–218, 438/238–255; 257/295–310, 532–535, E27.071
See application file for complete search history.

(56) References Cited

U.S. PATENT DOCUMENTS 7,011,999 B2 * 3/2006 Minami et al. ............. 438/210
7,208,364 B2 * 4/2007 Pan et al. .................. 438/210

\* cited by examiner

*Primary Examiner*—Cuong Nguyen
(74) *Attorney, Agent, or Firm*—McKenna Long & Aldridge LLP

(57) ABSTRACT

A semiconductor device having a high-voltage transistor and a polysilicon-insulator-polysilicon (PIP) capacitor, and a method for fabricating the same are provided. A current flow path of the high-voltage transistor is widened to reduce on-resistance of the device. Thus, electric characteristics of the device are enhanced. The semiconductor device includes a substrate having a high-voltage transistor area and a PIP capacitor area, an extended drain region disposed in the high-voltage transistor area and separated from a source region, an impurity region formed in an upper portion of the extended drain region, and a drain region formed on a surface of the substrate and disposed within the impurity region.

4 Claims, 2 Drawing Sheets

SEMICONDUCTOR DEVICE HAVING HIGH-VOLTAGE TRANSISTOR AND PIP CAPACITOR AND METHOD FOR FABRICATING THE SAME

This application claims the benefit of Korean Patent Application No. 10-2004-0117434, filed on Dec. 30, 2004, which is hereby incorporated by reference for all purposes as if fully set forth herein.

BACKGROUND OF THE INVENTION

1. Field of the Invention

The present invention relates to a semiconductor device and fabricating method thereof, and more particularly, to a semiconductor device having a high-voltage transistor and a polysilicon-insulator-polysilicon (PIP) capacitor, and a fabricating method thereof.

2. Discussion of the Related Art

FIGS. 1 and 2 illustrate a related art semiconductor device having a high-voltage transistor and a PIP capacitor.

Referring to FIG. 1, a well region (not shown) and an n⁻ extended drain region 110 are formed in a high-voltage transistor area of a p⁻ substrate 100 having a high-voltage transistor area and a PIP capacitor area. Subsequently, a LOCOS device isolation layer 120 is formed as a device isolation layer. After a pad oxide layer (not shown) for forming the LOCOS device isolation layer 120 has been removed, an oxide layer 130 to be used as a gate insulating layer in the high-voltage transistor area is formed over the substrate. A polysilicon layer 140 and an insulating layer pattern 150, e.g., an oxide layer pattern, are formed on the oxide layer 130 and the LOCOS device isolation layer 120. The insulating layer pattern 150 covers the entire high-voltage transistor area but exposes a surface of the polysilicon layer 140 corresponding to a PIP capacitor forming area within the PIP capacitor area. Subsequently, the exposed surface of the polysilicon layer 130 in the PIP capacitor area is doped with phosphorus oxychloride ($POCl_3$).

Referring to FIG. 2, the insulating layer pattern 150 is removed. By patterning the polysilicon layer 140 in the high-voltage transistor area and the PIP capacitor area, a gate conductive layer pattern 141 and a first electrode layer pattern 142 are formed in the high-voltage transistor area and the PIP capacitor area, respectively. A gate spacer layer 160 is formed on a lateral side of the gate conductive layer pattern 141. By ion implantation and annealing, an n⁺ source region 171 and an n⁺ drain region 272 are formed. Optionally, to form a lightly doped drain structure, ion implantation may be performed prior to forming a gate spacer layer 160 to form source/drain extended regions. Subsequently, a dielectric layer pattern 180 and a second electrode layer pattern 190 are sequentially stacked on the first electrode layer pattern 142 in the PIP capacitor area. By wiring, the n⁺ source and drain regions 171 and 272 in the high-voltage transistor area are electrically connected to source and drain electrodes S and D, respectively. The first and second electrode layer patterns 142 and 190 in the PIP capacitor area are electrically connected to lower and upper electrodes C1 and C2, respectively. Hence, the high-voltage transistor and the PIP capacitor are formed in the high-voltage transistor area and the PIP capacitor area, respectively.

A current path of the high-voltage transistor, shown by the arrow extending from n⁺ source region 171, includes a channel region in the substrate 100 under the gate conductive layer pattern 141 and a surface of the n⁻ extended drain region 110. Therefore, resistance is raised along the lightly doped n⁻ extended drain region 110 and an increase in on-resistance of a device occurs. This degrades the electrical characteristics of the device.

SUMMARY OF THE INVENTION

Accordingly, the present invention is directed to a semiconductor device having a high-voltage transistor and a PIP capacitor, and a method for fabricating the same, that substantially obviates one or more problems due to limitations and disadvantages of the related art.

An advantage of the present invention is to provide a semiconductor device having a high-voltage transistor and a PIP capacitor, in which a current flow path of the high-voltage transistor is widened to reduce on-resistance of the device.

Another advantage of the present invention is to provide a method of fabricating a semiconductor device having a high-voltage transistor and a PIP capacitor, in which electric characteristics of the device are enhanced.

Additional features and advantages of the invention will be set forth in the description which follows, and in part will be apparent from the description, or may be learned by practice of the invention. The objectives and other advantages of the invention will be realized and attained by the structure and method particularly pointed out in the written description and claims hereof as well as the appended drawings.

To achieve these and other advantages and in accordance with the purpose of the present invention, as embodied and broadly described, a semiconductor device includes a substrate having a high-voltage transistor area and a PIP capacitor area, an extended drain region disposed in the high-voltage transistor area, wherein the extended drain region is separated from a source region, an impurity region formed in an upper portion of the extended drain region, and a drain region formed on a surface of the substrate and disposed within the impurity region.

In another aspect of the present invention, a semiconductor device includes a substrate having a high-voltage transistor area and a polysilicon-insulator-polysilicon (PIP) capacitor area, a source region and an extended drain region separately formed in the high-voltage transistor area, an impurity region provided to an upper part within the extended drain region, a drain region within the impurity region, a gate stack disposed between the source region and the extended drain region, and a PIP capacitor having a first electrode layer pattern, a dielectric layer pattern, and a second electrode layer pattern sequentially stacked in the PIP capacitor area.

In another aspect of the present invention, a method of fabricating a semiconductor device includes defining a high-voltage transistor area and a PIP capacitor area on a substrate, forming an extended drain region in the high-voltage transistor area, forming a pad insulating layer on the substrate including the extended drain region, stacking a polysilicon layer and a mask layer on the pad insulating layer, patterning the mask layer to expose a PIP capacitor portion of the polysilicon layer, patterning the mask layer and the polysilicon layer to expose a drain region portion of the pad insulating layer in the high-voltage transistor area, and implanting impurity ions into the exposed portions of the pad insulating layer and the polysilicon layer to form an impurity region within the extended drain region and a first electrode layer on an ion-implanted portion of the polysilicon layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiment(s) of the invention and together with the description serve to explain the principle of the invention. In the drawings.

DETAILED DESCRIPTION OF THE INVENTION

Reference will now be made in detail to exemplary embodiments of the present invention, examples of which are illustrated in the accompanying drawings. Wherever possible, like reference designations will be used throughout the drawings to refer to the same or similar parts.

Figure 1:
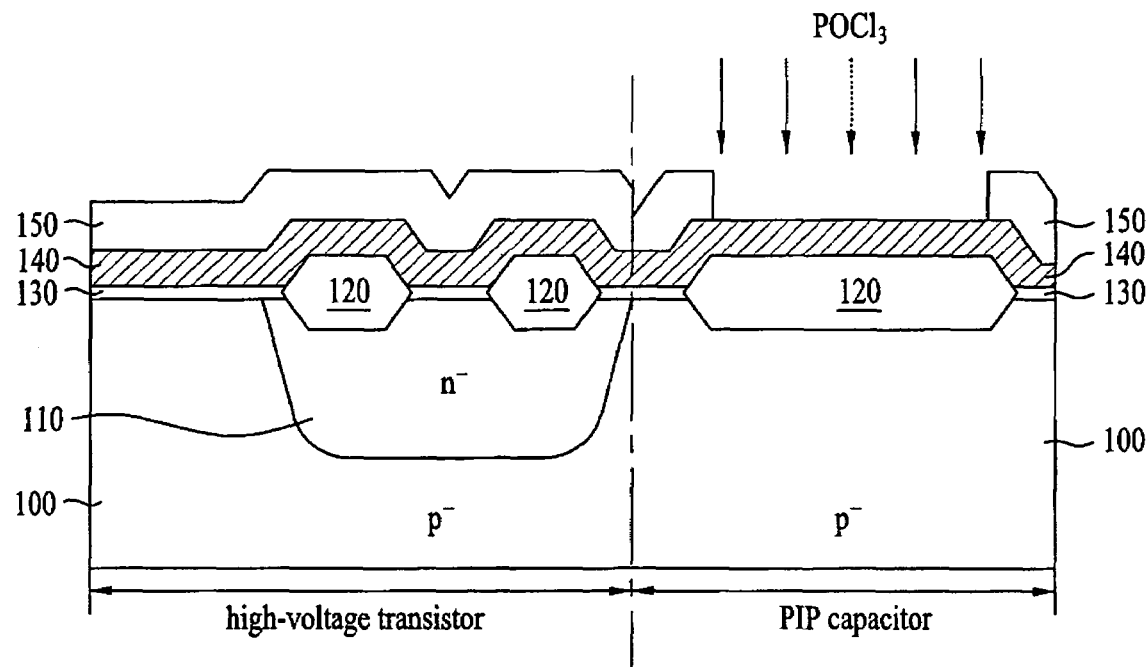
FIGS. 1 and 2 are cross-sectional diagrams of a related art semiconductor device having a high-voltage transistor and a PIP capacitor.
Figure 2:
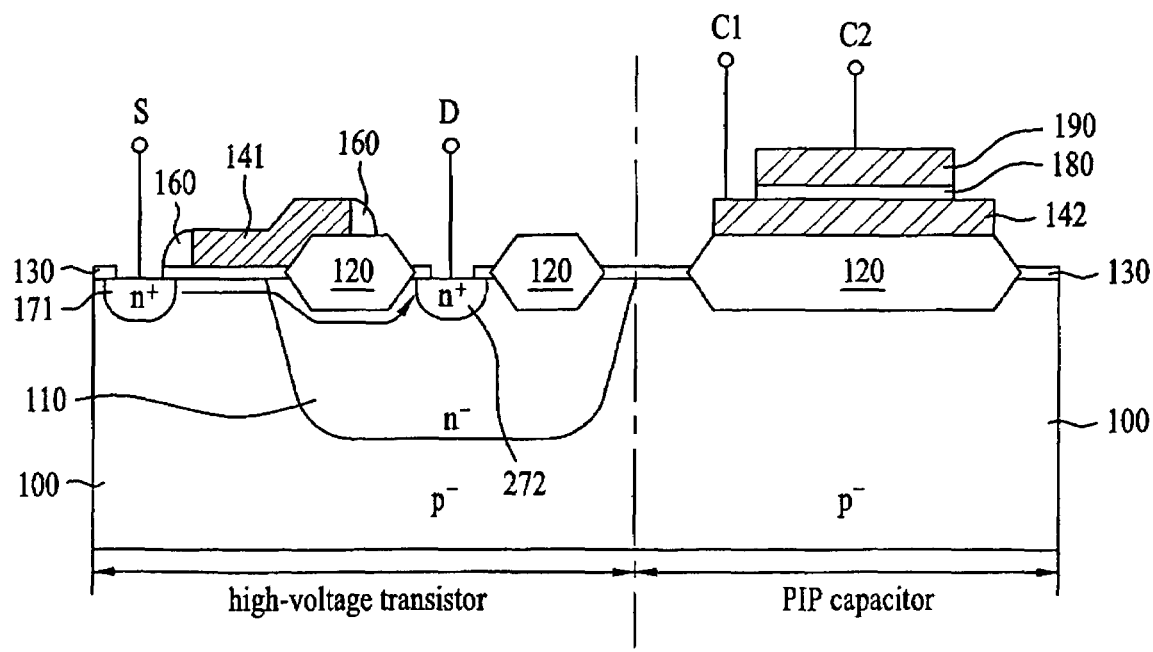
Figure 3:
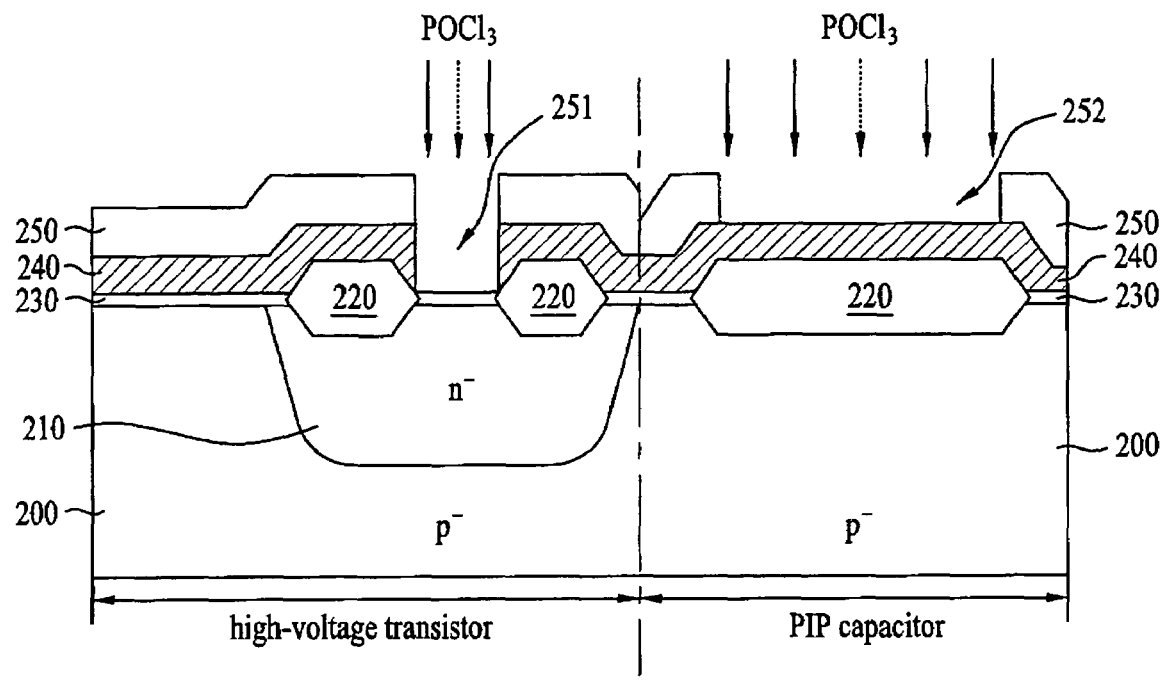
FIGS. 3 and 4 are cross-sectional diagrams of a semiconductor device having a high-voltage transistor and a PIP capacitor according to an exemplary embodiment of the present invention.
Figure 4:
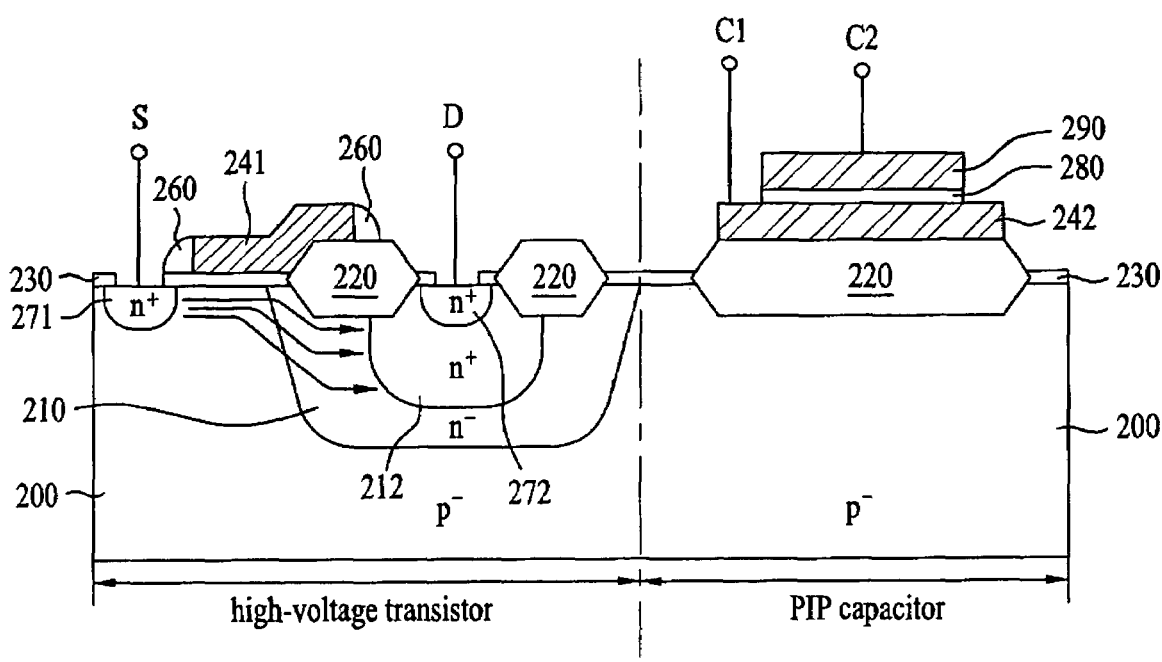

FIGS. 3 and 4 illustrate a semiconductor device according to an exemplary embodiment of the present invention. The semiconductor device includes a high-voltage transistor and a PIP capacitor, where the transistor and capacitor each having separately defined areas.

Referring to FIG. 3, to fabricate a semiconductor device having a high-voltage transistor and a PIP capacitor according to an exemplary embodiment of the present invention, a well region (not shown) is formed in a high-voltage transistor area of a $p^-$ substrate 200 having a high-voltage transistor area and a PIP capacitor area. Formation of the well region may be omitted in certain applications. An $n^-$ extended drain region 210 may be formed within the high-voltage transistor area by ion implantation using a predetermined mask layer pattern. The $n^-$ extended drain region 210 is used as a drift region.

Subsequently, a LOCOS device isolation layer 220 may be formed in the high-voltage transistor area and the PIP capacitor area by a general LOCOS process. An oxide layer 230, as a gate insulating layer, a polysilicon layer 240, as a gate conductive layer, and a lower electrode layer of a PIP capacitor are sequentially formed. An oxide layer pattern 250 is formed as a mask layer pattern on the polysilicon layer 240. The oxide layer pattern 250 has first and second openings 251 and 252 exposing portions of the high-voltage transistor and PIP capacitor areas, respectively. The first opening 251 exposes a surface of the polysilicon layer 240 where a drain region in the high-voltage transistor area will be formed. The second opening 252 exposes a surface of the polysilicon layer 240 that will become a first electrode layer as a lower electrode layer of a PIP capacitor in the PIP capacitor area.

By performing an etch process using the oxide layer pattern 250 as an etch mask, the exposed portion of the polysilicon layer 240 in the high-voltage transistor area is removed to expose a surface of the oxide layer 230 where the drain region will be formed. During this etching, the polysilicon layer 240 in the PIP capacitor area is protected by a separate mask (not shown). Subsequently, a implantation of phosphorus oxychloride ($POCl_3$) is performed over the substrate.

Referring to FIG. 4, by the $POCl_3$ implantation, the exposed portion of the polysilicon layer 240 in the PIP capacitor area is doped with $n^+$ type impurities to form a first electrode layer 242, while an $n^+$ impurity doped region 212 is formed within the $n^-$ type extended drain region 210 in the high-voltage transistor area. Subsequently, a gate conductive layer pattern 241 is formed on the oxide layer 230 in the high-voltage transistor area. A gate spacer layer 260 is formed on a sidewall of the gate conductive layer pattern 241. By general ion implantation, an $n^+$ type source region 271 and an $n^+$ type drain region 272 are formed within the high-voltage transistor area. The $n^+$ type drain region 272 is formed on the $n^+$ impurity doped region 212.

Subsequently, a dielectric layer 280 and a second electrode layer 290 are sequentially stacked on the first electrode layer pattern 242 in the PIP capacitor area. By wiring, the $n^+$ source and drain regions 271 and 272 in the high-voltage transistor area are electrically connected to source and drain electrodes S and D, respectively. The first and second electrode layers 242 and 290 in the PIP capacitor area are electrically connected to lower and upper electrodes C1 and C2, respectively. Hence, the high-voltage transistor and the PIP capacitor are formed in the high-voltage transistor area and the PIP capacitor area, respectively.

Since the portion reserved for the $n^+$ drain region 272 in the high-voltage transistor area is doped together with the first electrode layer 242 as the lower electrode layer of the PIP capacitor, the $n^+$ impurity doped region 212 is formed within the $n^-$ extended drain region 210. The $n^+$ impurity doped region 212 includes a junction deeper than the $n^+$ drain region 272. Hence, a width of a current flow path from the $n^+$ source region 271, as indicated by arrows shown in FIG. 4, is increased. On-resistance of the device is thereby reduced.

Accordingly, by forming the impurity region having the junction deeper than the drain region in the high-voltage transistor area in doping the lower electrode layer of the PIP capacitor, the current flow path in the high-voltage transistor can be widened to reduce the on-resistance of a device. Thus, electrical characteristics of the device can be enhanced.

It will be apparent to those skilled in the art that various modifications and variations can be made in the present invention without departing from the spirit or scope of the invention. Thus, it is intended that the present invention cover the modifications and variations provided they come within the scope of the appended claims and their equivalents.

What is claimed is:

1. A method of fabricating a semiconductor device, comprising:

defining a high-voltage transistor area and a polysilicon-insulator-polysilicon (PIP) capacitor area on a substrate;

forming an extended drain region in the high-voltage transistor area;

forming a pad insulating layer on the substrate including the extended drain region;

stacking a polysilicon layer and a mask layer on the pad insulating layer;

patterning the mask layer to expose a PIP capacitor portion of the polysilicon layer;

patterning the mask layer and the polysilicon layer to expose a drain region portion of the pad insulating layer in the high-voltage transistor area; and implanting impurity ions into the exposed portions of the pad insulating layer and the polysilicon layer to form an impurity region within the extended drain region and a first electrode layer on an ion-implanted portion of the polysilicon layer.

2. The method of claim 1, further comprising:

removing the mask layer;

forming a gate stack in the high-voltage transistor area;

forming a gate spacer layer on a lateral side of the gate stack;

forming a source region, defined by the gate spacer layer and a drain region, within the impurity region by ion implantation; and sequentially stacking a dielectric layer and a second electrode layer on a first electrode layer in the PIP capacitor area.

3. The method of claim 1, wherein the mask layer is formed of oxide.

4. The method of claim 1, wherein implanting impurity ions is performed by a $POCl_3$ ion implantation step.

* * * * *